(12) United States Patent
Li et al.

(10) Patent No.: US 12,156,425 B2
(45) Date of Patent: Nov. 26, 2024

(54) DISPLAY PANEL, METHOD FOR MANUFACTURING SAME, AND DISPLAY APPARATUS

(71) Applicants: Chongqing BOE Display Technology Co., Ltd., Chongqing (CN); BOE Technology Group Co., Ltd., Beijing (CN)

(72) Inventors: Jie Li, Beijing (CN); Wei Zhang, Beijing (CN); Wei Xia, Beijing (CN); Huaisen Ren, Beijing (CN)

(73) Assignees: Chongqing BOE Display Technology Co., Ltd., Chongqing (CN); BOE Technology Group Co., Ltd., Beijing (CN)

( * ) Notice: Subject to any disclaimer, the term of this patent is extended or adjusted under 35 U.S.C. 154(b) by 412 days.

(21) Appl. No.: 17/676,399

(22) Filed: Feb. 21, 2022

(65) Prior Publication Data

US 2022/0293891 A1    Sep. 15, 2022

(30) Foreign Application Priority Data

Mar. 11, 2021    (CN) .......................... 202110266341.3

(51) Int. Cl.
| | |
|---|---|
| *H10K 50/86* | (2023.01) |
| *H10K 50/818* | (2023.01) |
| *H10K 50/828* | (2023.01) |
| *H10K 50/844* | (2023.01) |
| *H10K 59/121* | (2023.01) |

(Continued)

(52) U.S. Cl.
CPC ......... *H10K 50/865* (2023.02); *H10K 50/818* (2023.02); *H10K 50/828* (2023.02); *H10K 50/844* (2023.02); *H10K 59/121* (2023.02); *H10K 59/131* (2023.02); *H10K 71/00* (2023.02)

(58) Field of Classification Search
CPC .. H10K 50/865; H10K 50/818; H10K 50/828; H10K 50/844; H10K 59/121; H10K 59/131; H10K 71/00; H10K 59/122; H10K 59/123; H10K 50/85; H10K 50/856
See application file for complete search history.

(56) References Cited

U.S. PATENT DOCUMENTS

| | | | |
|---|---|---|---|
| 2014/0291648 | A1 | 10/2014 | Yamazaki et al. |
| 2017/0373124 | A1* | 12/2017 | Yang ........................ H10K 59/12 |
| 2018/0158886 | A1 | 6/2018 | Dong et al. |

(Continued)

FOREIGN PATENT DOCUMENTS

| | | |
|---|---|---|
| CN | 105810719 A | 7/2016 |
| CN | 106941113 A | 7/2017 |
| CN | 112117315 A | 12/2020 |

OTHER PUBLICATIONS

CN202110266341.3 first office action.

*Primary Examiner* — J. E. Schoenholtz
(74) *Attorney, Agent, or Firm* — IPro, PLLC

(57) ABSTRACT

A display panel is provided. The display panel includes a substrate, a first insulation layer, a light-emitting device, and a support pattern. The first insulation layer is disposed on a side of the substrate. The light-emitting device is disposed in a pixel opening in the first insulation layer. The support pattern is disposed on a side, distal from the substrate, of the first insulation layer. The support pattern is disposed outside the pixel opening and is made of a light-absorbing material.

18 Claims, 5 Drawing Sheets

(51) Int. Cl.
*H10K 59/131* (2023.01)
*H10K 71/00* (2023.01)

(56) References Cited

U.S. PATENT DOCUMENTS

| | | |
|---|---|---|
| 2018/0331325 A1 | 11/2018 | Zhang |
| 2020/0075699 A1 | 3/2020 | Kim |
| 2022/0052121 A1* | 2/2022 | Jang ................... H10K 59/879 |
| 2022/0093690 A1 | 3/2022 | Wang et al. |
| 2022/0115612 A1* | 4/2022 | Ahn ................... H10K 50/115 |
| 2022/0285655 A1* | 9/2022 | Lee ................... H10K 59/38 |
| 2023/0029657 A1* | 2/2023 | Lee ................... H10K 59/122 |
| 2023/0043760 A1* | 2/2023 | Bae ................... H10K 50/865 |
| 2023/0354650 A1* | 11/2023 | Jung ................... H10K 59/353 |
| 2023/0371300 A1* | 11/2023 | Ahn ................... H10K 59/88 |

* cited by examiner

DISPLAY PANEL, METHOD FOR MANUFACTURING SAME, AND DISPLAY APPARATUS

CROSS-REFERENCE TO RELATED APPLICATION

This application claims priority to Chinese Patent Application No. 202110266341.3, filed on Mar. 11, 2021 and entitled "DISPLAY PANEL, METHOD FOR MANUFACTURING SAME, AND DISPLAY APPARATUS", the entire content of which is incorporated herein by reference.

TECHNICAL FIELD

The present disclosure relates to the field of display technologies, and in particular, to a display panel, a method for manufacturing the same, and a display apparatus.

BACKGROUND

Organic light-emitting diodes (OLED), as current-mode light-emitting devices, are increasingly applied to the field of high-performance display due to their characteristics of low power consumption, self-luminance, high color saturation, fast response, wide viewing angle, and capability of implementing flexibility.

SUMMARY

Embodiments of the present disclosure provide a display panel, a method for manufacturing the same, and a display apparatus. The technical solutions are as follows.

According to an aspect of the embodiments of the present disclosure, a display panel is provided. The display panel includes: a substrate; a first insulation layer disposed on a side of the substrate, wherein the first insulation layer is provided with a plurality of pixel openings; a light-emitting device disposed in the pixel opening, and a support pattern disposed on a side, distal from the substrate, of the first insulation layer, wherein the support pattern is disposed outside the pixel opening and is made of a light-absorbing material.

In some embodiments, the light-absorbing material includes a black matrix material.

In some embodiments, the support pattern is in a mesh shape, and an orthographic projection, on the substrate, of the pixel opening is within an orthographic projection, on the substrate, of an opening in the support pattern.

In some embodiments, a shape of the orthographic projection, on the substrate, of the opening in the support pattern is the same as a shape of the orthographic projection, on the substrate, of the pixel opening.

In some embodiments, the orthographic projection, on the substrate, of the opening in the support pattern is rectangular.

In some embodiments, the substrate is provided with a signal line electrically connected to the light-emitting device, and an orthographic projection, on the substrate, of the support pattern covers an area where the signal line is disposed.

In some embodiments, an area of an opening surface on a side, proximal to the substrate, of the pixel opening is less than an area of an opening surface on a side, distal from the substrate, of the pixel opening; and the light-emitting device includes a first electrode, wherein the first electrode is at least partially in contact with a side wall of the pixel opening.

In some embodiments, the first electrode covers a bottom, proximal to the substrate, of the pixel opening and the side wall of the pixel opening.

In some embodiments, the light-emitting device further includes a light-emitting layer and a second electrode, wherein the light-emitting layer is disposed on a side, distal from the substrate, of the first electrode; the second electrode is disposed on a side, distal from the first electrode, of the light-emitting layer; and an orthographic projection, on the substrate, of the second electrode is not overlapped with an orthographic projection, on the substrate, of the support pattern.

In some embodiments, the substrate is provided with a pixel driving circuit electrically connected to the first electrode, and the first insulation layer is further provided with a first connecting hole, wherein the first electrode is electrically connected to the pixel driving circuit through the first connecting hole, and an orthographic projection, on the substrate, of the first connecting hole is not overlapped with an orthographic projection, on the substrate, of the light-emitting layer.

In some embodiments, the substrate includes a base, as well as the pixel driving circuit, a second insulation layer, and a connecting electrode that are disposed on a side of the base, wherein the second insulation layer is provided with a second connecting hole; the connecting electrode is electrically connected to the pixel driving circuit through the second connecting hole; and the first electrode is electrically connected to the connecting electrode through the first connecting hole.

In some embodiments, an orthographic projection, on the base, of the second connecting hole is overlapped with at least part of an orthographic projection, on the base, of the first connecting hole.

In some embodiments, a thickness of the second insulation layer ranges from 2 to 5 micrometers.

In some embodiments, the first electrode is a reflective electrode made of a reflecting metal material, and the second electrode is a light-transmitting electrode made of a transparent conductive material.

In some embodiments, the display panel further includes, an encapsulation layer disposed on a side, distal from the substrate, of the support pattern, wherein the encapsulation layer is configured to encapsulate the light-emitting device.

In some embodiments, the encapsulation layer includes a first inorganic encapsulation layer, an organic encapsulation layer, and a second inorganic encapsulation layer that are laminated.

In some embodiments, the display panel further includes: a plurality of filters disposed on a side, distal from the substrate, of the encapsulation layer, wherein any two adjacent filters are in contact with each other.

In some embodiments, the display panel further includes: a protective layer disposed on a side, distal from the substrate, of the plurality of filters.

According to another aspect of the embodiments of the present disclosure, a method for manufacturing a display panel is provided. The method includes: providing a substrate; forming a first insulation layer on a side of the substrate, wherein the first insulation layer is provided with a plurality of pixel openings; forming a light-emitting device in the pixel opening; and forming a support pattern on a side, distal from the substrate, of the first insulation layer, wherein the support pattern is disposed outside the pixel opening and is made of a light-absorbing material.

According to still another aspect of the embodiments of the present disclosure, a display apparatus is provided. The display apparatus includes: a power supply assembly and a display panel, wherein the power supply assembly is configured to supply power to the display panel; and the display panel includes: a substrate; a first insulation layer disposed on a side of the substrate, wherein the first insulation layer is provided with a plurality of pixel openings; a light-emitting device disposed in the pixel opening; and a support pattern disposed on a side, distal from the substrate, of the first insulation layer, wherein the support pattern is disposed outside the pixel opening and is made of a light-absorbing material.

DETAILED DESCRIPTION

For clearer descriptions of the objectives, technical solutions, and advantages of the present disclosure, embodiments of the present disclosure are described in detail below with reference to the accompanying drawings.

Currently, to reduce the reflectivity of an internal structure of an OLED display panel to ambient light, the following two approaches are usually used. In the first approach, a circular polarizer is attached to a light-emitting side of the OLED display panel. The circular polarizer can reduce the quantity of ambient light which is reflected by the internal structure of the OLED display panel and emitted from the light-emitting surface of the OLED display panel, after the ambient light enters the OLED display panel. In the second approach, a color filter is encapsulated on the light-emitting side of the OLED display panel. Since the color filter can filter light, after the ambient light enters the OLED display panel, the quantity of ambient light which is reflected by the internal structure of the OLED display panel and emitted from the light-emitting surface of the OLED display panel can be reduced. In addition, compared with the circular polarizer, the color filter has higher transmittance of light emitted from the OLED display panel, and OLED the display panel integrated with the color filter is thinner. Therefore, more and more OLED display panels use color filters to reduce the reflectivity of the internal structure to ambient light.

Figure 1:
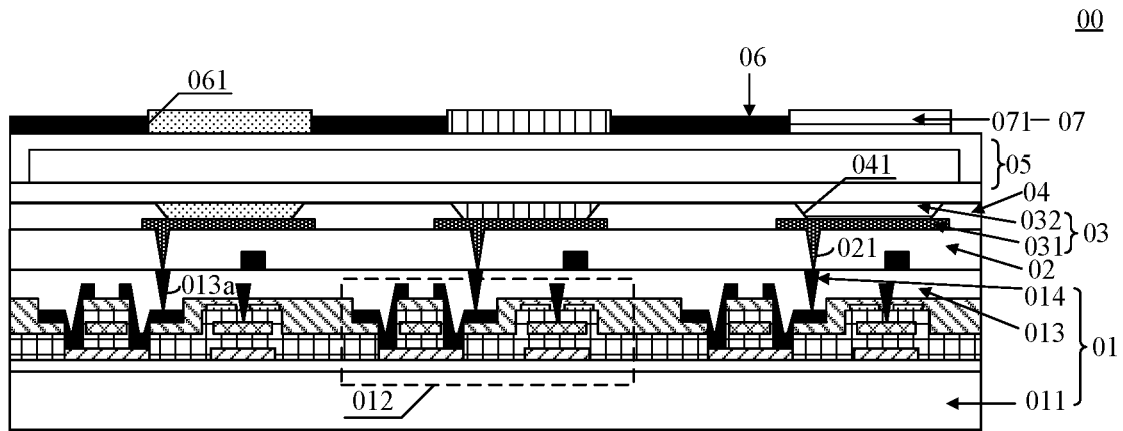
FIG. 1 is a schematic diagram of a film layer structure of a display panel according to the related art.

In the related art, referring to FIG. 1 which is a schematic diagram of a film layer structure of a display panel according to the related art, the display panel 00 may include a substrate 01, as well as a light-emitting device 03, a pixel definition layer 04, an encapsulation layer 05, a black matrix 06, and a filter layer 07 that are disposed on a side of the substrate 01.

The light-emitting device 03 may include a first electrode 031, a light-emitting layer 032, and a second electrode (not shown in the figure) that are laminated. The first electrode 031 is a reflective electrode, and may usually be referred to as an anode. The second electrode is a light-transmitting electrode, and may usually be referred to as a cathode. The pixel definition layer 04 is provided with a pixel opening 041. The light-emitting layer 032 in the light-emitting device 03 is disposed in the pixel opening 041.

The encapsulation layer 05 is disposed on the side, distal from the substrate 01, of the pixel definition layer 04. The encapsulation layer 05 is configured to encapsulate the light-emitting device 03, so as to isolate the light-emitting device 03 from outside air, thereby protecting the light-emitting layer 032 in the light-emitting device 03 from being eroded by moisture, oxygen and the like in air.

The black matrix 06 is provided with a plurality of openings 061. The filter layer 07 is provided with a plurality of filters 071 that are in one-to-one correspondence to the plurality of openings 061. Each filter 071 may be disposed in a corresponding opening 061 in the black matrix 06. Therefore, the black matrix 06 can not only shield a signal line that is in the display panel 00 and electrically connected to the pixel driving circuit 011, but also decrease the probability that color mixture occurs when light of different colors emitted from the light-emitting devices 03 is emitted from the display panel 00, thereby improving the display effect of the display panel 00.

There are the following two types of openings in the display panel 00: the pixel openings 041 and the openings 061 in the black matrix 06. The pixel openings 041 and the openings 061 in the black matrix 06 are receptively formed in two sides of the encapsulation layer 05. Therefore, when the display panel 00 is in a screen-off state, after ambient light emitted into the display panel 00 is reflected by the first electrode 031 in the display panel 00, reflected light sequentially passes through the pixel opening 041 and the opening 061 in the black matrix 06, and pinhole diffraction occurs twice. In addition, the shape of the pixel opening 041 is different from that of the opening 061 in the black matrix 06. Therefore, diffraction patterns generated during the two pinhole diffractions of the reflected light are different. Thus, the color separation phenomenon occurs in the display panel 00, which causes relatively low reliability of the display panel 00.

Figure 2:
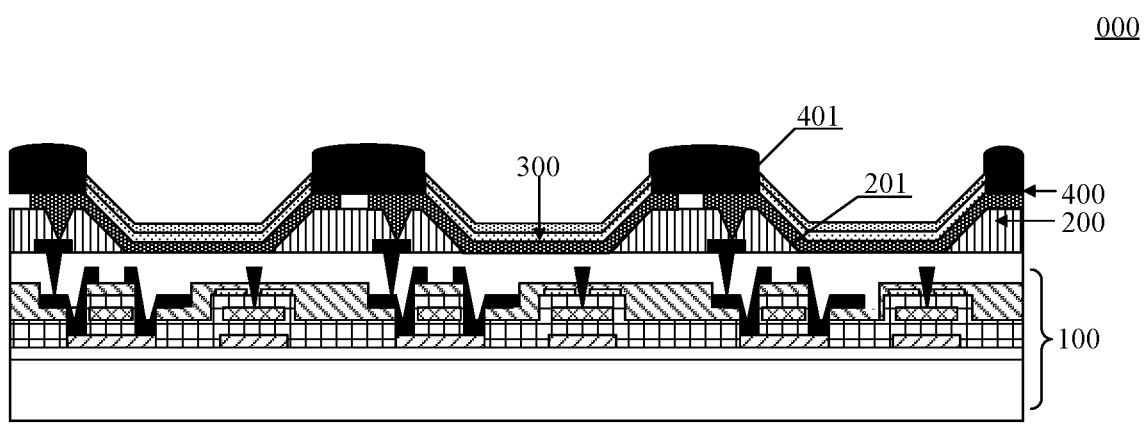
FIG. 2 is a schematic diagram of a film layer structure of a display panel according to an embodiment of the present disclosure.

Referring to FIG. 2 which is a schematic diagram of a film layer structure of a display panel according to an embodiment of the present disclosure, the display panel 000 may include a substrate 100, a first insulation layer 200, a light-emitting device 300, and a support pattern 400.

The first insulation layer 200 is disposed on a side of the substrate 100 and is provided with a plurality of pixel openings 201.

The light-emitting device 300 is disposed in the pixel opening 201.

The support pattern 400 may be distributed on the side, distal from the substrate 100, of the first insulation layer 200 and disposed outside the pixel opening 201. In other words, an orthographic projection of the support pattern 400 on the substrate 100 is within an orthographic projection of the first insulation layer 200 on the substrate 100. The support pattern 400 is made of a light-absorbing material.

In this embodiment of the present disclosure, because the support pattern 400 in the display panel 000 is made of the light-absorbing material, the support pattern 400 can replace the black matrix in the display panel 000. In addition, because the orthographic projection of the support pattern 400 on the substrate 100 is within the orthographic projection of the first insulation layer 200 on the substrate 100, the support pattern 400 is provided with an opening 401 communicated with the pixel opening 201. In this case, in the display panel 000, there is only one type of openings, including the pixel openings 201 and the openings 401 in the support pattern 400 that are communicated with each other. Thus, after a reflective structure in the display panel 000 reflects ambient light, reflected ambient light is emitted out from only the openings including the pixel openings 201 and the openings 401 in the support pattern 400, thereby reducing the times of pinhole diffraction generated by ambient light that is reflected only once, and avoiding the phenomenon that reflected ambient light generates twice pinhole diffraction with different diffraction patterns. Therefore, the probability that color separation occurs in the display panel 000 is decreased, and the reliability of the display panel 000 is effectively improved. In addition, by replacing the black matrix with the support pattern 400, it is unnecessary to manufacture the black matrix in the display panel 000, which effectively simplifies the manufacture process of the display panel 000, and reduces the manufacture cost of the display panel 000.

In summary, the display panel according to this embodiment of the present disclosure includes the substrate, the first insulation layer, the light-emitting device, and the support pattern. Because the support pattern in the display panel is made of the light-absorbing material, the support pattern can replace the black matrix in the display panel. In addition, the orthographic projection, on the substrate, of the support pattern is within the orthographic projection, on the substrate, of the first insulation layer. Therefore, the support pattern is provided with an opening communicated with the pixel opening. In this case, in the display panel, there is only one type of openings, including the pixel openings and the openings in the support pattern that are communicated with each other. Therefore, after a reflective structure in the display panel reflects ambient light, reflected ambient light is emitted out from only one type of the openings, including the pixel openings and the openings in the support pattern, thereby reducing the times of pinhole diffraction generated by ambient light that is reflected only once, and avoiding the phenomenon that reflected ambient light generates twice pinhole diffraction with different diffraction patterns. Further, the probability that color separation occurs in the display panel is decreased, and the reliability of the display panel is effectively improved. In addition, by replacing the black matrix with the support pattern, the manufacture process of the display panel is effectively simplified, and the manufacture cost of the display panel is reduced.

In the present disclosure, the light-absorbing material for making the support pattern 400 may include a black matrix material, such that the support pattern 400 may have relatively high light absorptivity. In this embodiment of the present disclosure, the substrate 100 may be provided with a signal line electrically connected to the light-emitting device 300, and the orthographic projection, on the substrate 100, of the support pattern 400 covers the area where the signal line is disposed. In this way, the support pattern 400 can shield the signal line in the substrate 100, to prevent the signal line from reflecting ambient light, thereby improving the display effect of the display panel 000. In addition, the support pattern 400 may further decrease the probability that in the display panel 000, color mixture occurs when light of different colors emitted from the light-emitting devices 300 in the pixel openings 201 is emitted from the display panel 000.

In some embodiments, the support pattern 400 may be in a mesh shape, and an orthographic projection, on the substrate 100, of the pixel opening 201 is within an orthographic projection, on the substrate 100, of the opening 401 in the support pattern 400.

For example, the orthographic projection, on the substrate 100, of the opening 401 in the support pattern 400 may be of a plurality of shapes. The embodiments of the present disclosure are illustratively described by taking the following two possible implementations as examples.

In the first possible implementation, the shape of the orthographic projection, on the substrate 100, of the opening 401 in the support pattern 400 is the same as the shape of the orthographic projection, on the substrate 100, of the pixel opening 201. For example, both the orthographic projection, on the substrate 100, of the opening 401 in the support pattern 400 and the orthographic projection, on the substrate 100, of the pixel opening 201 may be quadrilateral, hexagonal, circular, or the like. In some embodiments, the size of the orthographic projection, on the substrate 100, of the opening 401 in the support pattern 400 may also be the same as the size of the orthographic projection, on the substrate 100, of the pixel opening 201. In this case, the boundary of the orthographic projection, on the substrate 100, of the pixel opening 201 may overlap with the boundary of the orthographic projection, on the substrate 10, of the opening 401 in the support pattern 400.

In the second possible implementation, the orthographic projection, on the substrate 100, of the opening 401 in the support pattern 400 is rectangular.

Figure 3:
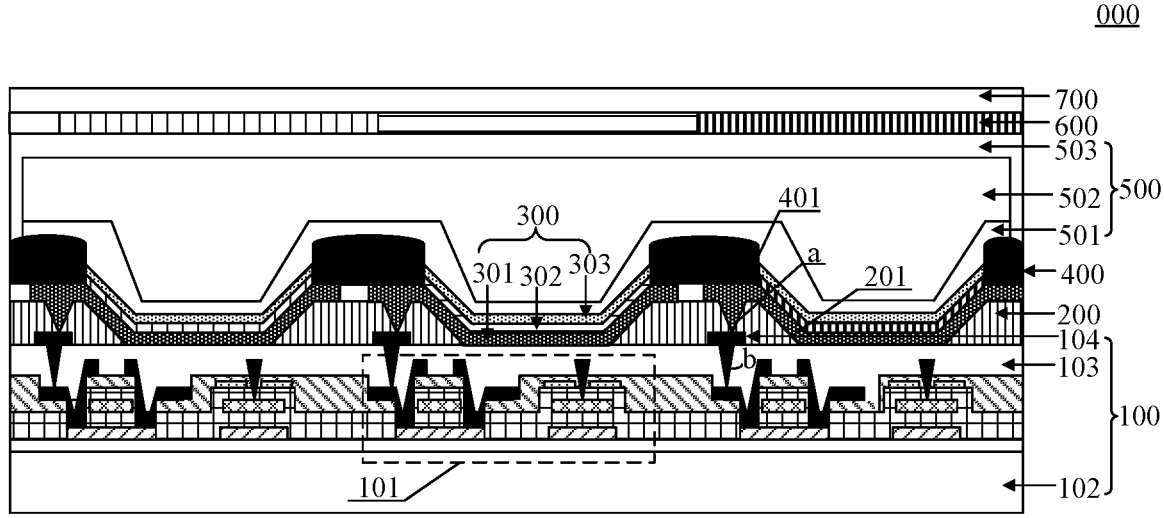
FIG. 3 is a schematic diagram of a film layer structure of another display panel according to an embodiment of the present disclosure.

In the present disclosure, referring to FIG. 3 which is a schematic diagram of a film layer structure of another display panel according to an embodiment of the present disclosure, in the display panel 000, the area of an opening surface on the side, proximal to the substrate 100, of the pixel opening 201 in the first insulation layer 200 is less than the area of an opening surface on the side, distal from the substrate 100, of the pixel opening 201. The light-emitting device 300 in the display panel 000 may include a first electrode 301. The first electrode 301 is at least partially in contact with a side wall of the pixel opening 201. In this way, when the display panel 000 is in a screen-off state, ambient light reflected by the first electrode 301 may converge in a central area in the pixel opening 201, which can further reduce the generation probability of diffraction phenomena, thereby decreasing the probability that color separation occurs in the display panel 000. When the display panel 000 is in a screen-on state, light emitted from the light-emitting device 300 and reflected by the first electrode 301 may also converge in the central area in the pixel opening 201, which can further decrease the probability that color mixture occurs when light of different colors emitted from the light-emitting devices 300 is emitted from the display panel 000, thereby decreasing the probability that color shift occurs in the display panel 000 and improving the light-emitting efficiency of the display panel 000.

It should be noted that, the first electrode 301 is a reflective electrode, and may usually be referred to as an anode. For example, the first electrode 301 may usually be a reflective electrode made of a reflecting metal material.

In some embodiments, as shown in FIG. 3, the first electrode 301 in the display panel 000 covers the bottom, proximal to the substrate 100, of the pixel opening 201 and the side wall of the pixel opening 201. In this way, the first electrode 301 has a relatively high capability of converging light, which can further decrease the probability that color separation and color shift occur in the display panel 000, and further improve the light-emitting efficiency of the display panel 000.

In the present disclosure, referring to FIG. 3, the light-emitting device 300 in the display panel 000 may further include a light-emitting layer 302 and a second electrode 303. The light-emitting layer 302 is disposed on the side, distal from the substrate 100, of the first electrode 301. The second electrode 303 is disposed on the side, distal from the first electrode 301, of the light-emitting layer 302. In this case, the light-emitting device 300 may be an OLED light-emitting device.

An orthographic projection, on the substrate 100, of the second electrode 303 of the light-emitting device 300 is staggered from the orthographic projection, on the substrate 100, of the support pattern 400. In this way, in the display panel 000, no second electrode 303 is provided on the side, distal from the substrate 100, of the support pattern 400, which avoids the phenomenon that ambient light is reflected by the second electrode 303 when the second electrode 303 is disposed on the side, distal from the substrate 100, of the support pattern 400. Therefore, the probability that color separation occurs in the display panel 000 is further decreased. In addition, the following phenomenon may also be avoided: the light absorption capability of the support pattern 400 is reduced when the second electrode 303 is disposed on the side, distal from the substrate 100, of the support pattern 400.

It should be noted that, the second electrode 303 is a light-transmitting electrode, and may usually be referred to as a cathode. For example, the second electrode 303 is usually a light-transmitting electrode made of a transparent conductive material.

In the present disclosure, referring to FIG. 3, the substrate 100 in the display panel 000 is further provided with a pixel driving circuit 101 electrically connected to the first electrode 301 in the light-emitting device 300. For example, the signal line in the substrate 100 may be electrically connected to the light-emitting device 300 through the pixel driving circuit 101.

The first insulation layer 200 is further provided with a first connecting hole a. The first electrode 301 in the light-emitting device 300 may be electrically connected to the pixel driving circuit 101 through the first connecting hole a, and an orthographic projection, on the substrate 100, of the first connecting hole a does not overlap with an orthographic projection, on the substrate 100, of the light-emitting layer 302.

In the related art, referring to FIG. 1, the substrate 01 in the display panel 00 may include a base 011, as well as a pixel driving circuit 012, a second insulation layer 013, and a connecting electrode 014 that are disposed on a side of the base. The second insulation layer 013 is provided with a second connecting hole 013a. The connecting electrode 014 is electrically connected to the pixel driving circuit 012 through the second connecting hole 013a. The display panel 00 may further include a first insulation layer 02 disposed between the substrate 01 and the light-emitting device 03. The first insulation layer 02 is provided with a first connecting hole 021. The first electrode 031 in the light-emitting device 03 is electrically connected to the connecting electrode 014 through the first connecting hole 021.

In the display panel 00, an orthographic projection, on the substrate 01, of the first connecting hole 021 overlaps with at least part of an orthographic projection, on the substrate 01, of the light-emitting layer 032. Therefore, the connecting electrode 014 is disposed on the side, proximal to the substrate 01, of the first electrode 031, and the flatness of the first electrode 031 is relatively poor. As a result, ambient light is reflected by the first electrode 031 in different directions, which further aggravates the color separation occurred in the display panel 00.

However, in the display panel 000 according to this embodiment of the present disclosure, the orthographic projection, on the substrate 100, of the first connecting hole a does not overlap with the orthographic projection, on the substrate 100, of the light-emitting layer 302. Therefore, fewer structures are provided on the side, proximal to the substrate 100, of the first electrode 301 in the pixel opening 201, which can improve the flatness of the first electrode 301, and further decrease the probability that color separation occurs in the display panel 000. In addition, compared with the related art, in the display panel 000 according to this embodiment of the present disclosure, the pixel opening 201 is disposed in the first insulation layer 200. Thus, a pixel definition layer may be omitted, and it is unnecessary to independently integrate the pixel definition layer into the display panel 000, which further simplifies the manufacture process of the display panel 000, and reduces the manufacture cost of the display panel 000.

In this embodiment of the present disclosure, referring to FIG. 3, the substrate 100 in the display panel 000 may include a base 102, as well as a pixel driving circuit 101, a second insulation layer 103, and a connecting electrode 104 that are disposed on a side of the base 102. The second insulation layer 103 is provided with a second connecting hole b. The connecting electrode 104 may be electrically connected to the pixel driving circuit 101 through the second connecting hole b. The first electrode 301 may be electrically connected to the connecting electrode 104 through the first connecting hole a.

In some embodiments, an orthographic projection, on the base 102, of the second connecting hole b overlaps with at least part of an orthographic projection, on the base 102, of the first connecting hole a. In this way, it can be ensured that in the display panel 000, no connecting electrode 104 is disposed on the side, proximal to the substrate 100, of the first electrode 301 in the pixel opening 201, which can improve the flatness of the first electrode 301, and further decrease the probability that color separation occurs in the display panel 000.

In the present disclosure, the thickness of the second insulation layer 103 ranges from 2 to 5 micrometers. Compared with the related art, the second insulation layer 103 in the display panel 000 according to this embodiment of the present disclosure is relatively thicker, which can further improve the flatness of the first electrode 301, and decrease the probability that color separation occurs in the display panel 000.

In this embodiment of the present disclosure, the display panel 000 may further include an encapsulation layer 500 disposed on the side, distal from the substrate 100, of the support pattern 400. The encapsulation layer 500 is configured to encapsulate the light-emitting device 300.

For example, the encapsulation layer 500 may include a first inorganic encapsulation layer 501, an organic encapsulation layer 502, and a second inorganic encapsulation layer 503 that are laminated. The encapsulation layer 500 can encapsulate the light-emitting device 300, to isolate the light-emitting device 300 from outside air, thereby protecting the light-emitting layer 302 in the light-emitting device 30) from being eroded by moisture, oxygen and the like in air.

In this embodiment of the present disclosure, the display panel 000 may further include a plurality of filters 600 disposed on the side, distal from the substrate 100, of the encapsulation layer 500. Any two adjacent filters 600 are in contact with each other. In this way, in the display panel 000, the support pattern 400 is adopted to replace the black matrix disposed between the plurality of filters 600 in the related art, which not only decreases the probability that color separation occurs in the display panel 000, but also further simplifies the manufacture process of the display panel 000, thereby reducing the manufacture cost of the display panel 000.

For example, the plurality of filters 600 may include filters of at least two colors. For example, the plurality of filters 600 may include filters of three colors. The filters of three colors may be: a red filter, a green filter, and a blue filter.

In some embodiments, the display panel 000 may further include a protective layer 700 disposed on the side, distal from the substrate 100, of the plurality of filters 600. The protective layer 700 is configured to protect the plurality of filters 600 and the protective layer 700 can improve the flatness of the light-emitting side of the display panel 000.

In summary, the display panel according to this embodiment of the present disclosure includes the substrate, the first insulation layer, the light-emitting device, and the support pattern. Because the support pattern in the display panel is made of the light-absorbing material, the support pattern can replace the black matrix in the display panel. In addition, the orthographic projection, on the substrate, of the support pattern is within the orthographic projection, on the substrate, of the first insulation layer. Therefore, the support pattern is provided with an opening communicated with the pixel opening. In this case, in the display panel, there is only one type of openings, including the pixel openings and the openings in the support pattern that are communicated with each other. In this case, after a reflective structure in the display panel reflects ambient light, reflected ambient light is emitted out from only the openings including the pixel openings and the openings in the support pattern, thereby reducing the times of pinhole diffraction generated by ambient light that is reflected only once, and then avoiding the phenomenon that reflected ambient light generates twice pinhole diffraction with different diffraction patterns. Further, the probability that color separation occurs in the display panel is decreased, and the reliability of the display panel is effectively improved. In addition, the support pattern is used to replace the black matrix, which effectively simplifies the manufacture process of the display panel, and reduces the manufacture cost of the display panel.

An embodiment of the present disclosure further provides a method for manufacturing a display panel. The method for manufacturing a display panel is applicable for manufacturing the display panel shown in FIG. 2. The method for manufacturing a display panel may include the following steps.

In step A1, a substrate is provided.

In step A2, a first insulation layer is formed on a side of the substrate. The first insulation layer is provided with a plurality of pixel openings.

In step A3, a light-emitting device is formed in the pixel opening.

In step A4, a support pattern is formed on the side, distal from the substrate, of the first insulation layer. The support pattern is disposed outside the pixel opening and is made of a light-absorbing material.

In summary, according to the method for manufacturing a display panel in this embodiment of the present disclosure, because the support pattern in the display panel is made of the light-absorbing material, the support pattern can replace the black matrix in the display panel. In addition, the orthographic projection, on the substrate, of the support pattern is within the orthographic projection, on the substrate, of the first insulation layer. Therefore, the support pattern is provided with an opening communicated with the pixel opening. In this case, in the display panel, there is only one type of openings including the pixel openings and the openings in the support pattern that are communicated with each other. In this case, after a reflective structure in the display panel reflects ambient light, reflected ambient light is emitted out from only the openings including the pixel openings and the openings in the support pattern, thereby reducing times of pinhole diffraction generated by ambient light that is reflected only once, and avoiding the phenomenon that reflected ambient light generates twice pinhole diffraction with different diffraction patterns. Further, the probability that color separation occurs in the display panel is decreased, and the reliability of the display panel is effectively improved. In addition, the support pattern is used to replace the black matrix, which effectively simplifies the manufacture process of the display panel, and reduces the manufacture cost of the display panel.

An embodiment of the present disclosure further provides another method for manufacturing a display panel. The method for manufacturing a display panel is applicable for manufacturing the display panel shown in FIG. 3. The method for manufacturing a display panel may further include the following steps.

In step B1, a substrate with a pixel driving circuit is provided.

Figure 4:
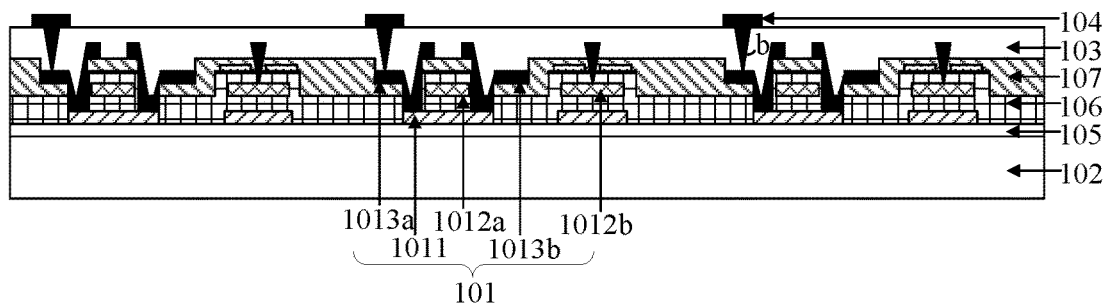
FIG. 4 is a schematic diagram of a film layer structure of a substrate according to an embodiment of the present disclosure.

For example, as shown in FIG. 4 which is a schematic diagram of a film layer structure of a substrate according to an embodiment of the present disclosure, the substrate 100 may include: a base 102, as well as a buffer layer 105, an active layer pattern 1011, a gate insulation layer pattern 106, a gate pattern 1012, an intermediate insulation layer 107, a source/drain pattern 1013, a second insulation layer 103, and a connecting electrode 104 that are laminated on a side of the base 102 in a direction going distal from the base 102.

In the present disclosure, providing the substrate with the pixel driving circuit and a cathode signal line may include the following processes.

First, the buffer layer 105 is formed on the base 102. In some embodiments, the material of the buffer layer 105 may include an inorganic material such as silicon nitride, silicon oxide, silicon oxynitride or the like. In the present disclosure, the thickness of the buffer layer 105 ranges from 0.6 to 3 micrometers. The buffer layer 105 is configured to prevent ions in the base 102 from entering the active layer pattern 1011, thereby avoiding the performance of the active layer pattern 1011 from be affected. Optionally, the material of the base 102 may include polyimide.

Next, an active material film is formed on the base 102 on which the buffer layer 105 is formed, and a one-time patterning process is performed on the active material film to form the active layer pattern 1011. In some embodiments, the material of the active layer pattern 1011 may include a semiconductor material such as polysilicon, amorphous silicon, an oxide semiconductor or the like.

Then, a gate insulation film and a gate layer are formed on the base 102 on which the active layer pattern 1011 is formed, and the one-time patterning process is performed on the gate layer to form the gate insulation layer 106 and the gate pattern. The gate pattern may include a first gate 1012a, a second gate 1012b, and a gate line (not shown in FIG. 4) connected to the first gate 1012a and the second gate 1012b. In some embodiments, the material of the gate insulation layer 106 may include silicon dioxide, silicon nitride, or a mixture of silicon dioxide and silicon nitride; and the material of the gate pattern 1012 may include a metal material such as aluminum, silver, molybdenum, or an alloy. The gate line is configured to apply voltage to the first gate 1012a and the second gate 1012b.

Then, an intermediate insulation film is formed on the base 102 on which the gate pattern 1012 is formed, and the one-time patterning process is performed on the intermediate insulation film to form the intermediate insulation layer 107. In some embodiments, the material of the intermediate insulation layer 107 may include silicon dioxide, silicon nitride, or a mixture of silicon dioxide and silicon nitride.

Then, a source/drain material layer is formed on the base 102 on which the intermediate insulation layer 107 is formed, and the one-time patterning process is performed on the source/drain material layer to form the source/drain pattern. The source/drain pattern may include a source 1013a, a drain 1013b, and a data line (not shown in FIG. 4). In some embodiments, the material of the source/drain pattern 1013 may include a metal material such as aluminum, silver, molybdenum, or an alloy.

The data line may be electrically connected to one of the source 1013a and the drain 1013b, and the other one of the source 1013a and the drain 1013b may be electrically connected to an anode layer, which is formed subsequently, in the light-emitting device.

It should be noted that, the first gate 1012a, the second gate 1012b, the active layer pattern 1011, the source 1013a, the drain 1013b and the like structures can form the pixel driving circuit 101 in the foregoing embodiment.

Then, a second insulation film is formed on the base 102 on which the source/drain pattern 1013 is formed, and the one-time patterning process is performed on the second insulation film to form the second insulation layer 103. The second insulation layer 103 is provided with a second connecting hole b.

Subsequently, a first conductive film is formed on the base 102 on which the second insulation layer 103 is formed, and the one-time patterning process is performed on the first conductive film to form the connecting electrode 104.

It should be noted that, the substrate 100 with the pixel driving circuit 101 may be formed by the foregoing processes.

In step B2, a first insulation layer is formed on the substrate.

Figure 5:
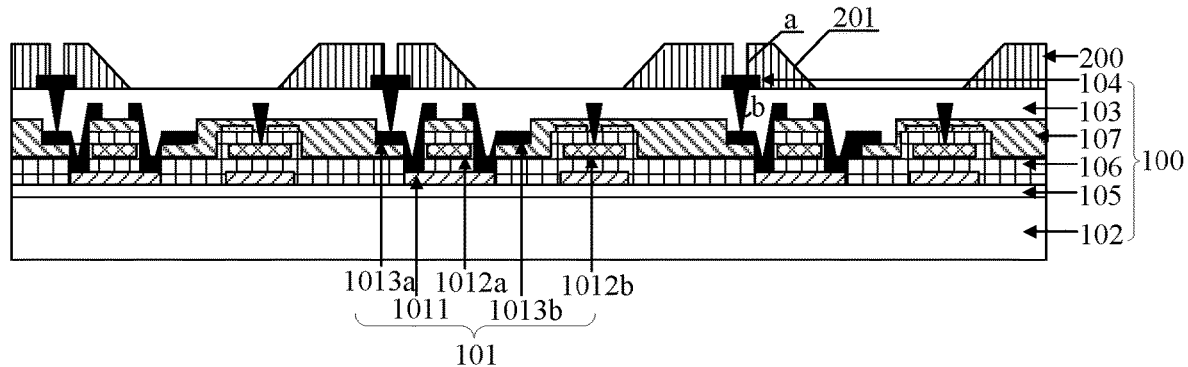
FIG. 5 is a schematic diagram of forming a first insulation layer according to an embodiment of the present disclosure.

For example, referring to FIG. 5 which is a schematic diagram of forming a first insulation layer according to an embodiment of the present disclosure, a first insulation film is formed on the substrate 100, and the one-time patterning process is performed on the first insulation film to form the first insulation layer 200. The first insulation layer 200 is provided with a first connecting hole a and a pixel opening 201.

In step B3, a first electrode is formed on the first insulation layer.

Figure 6:
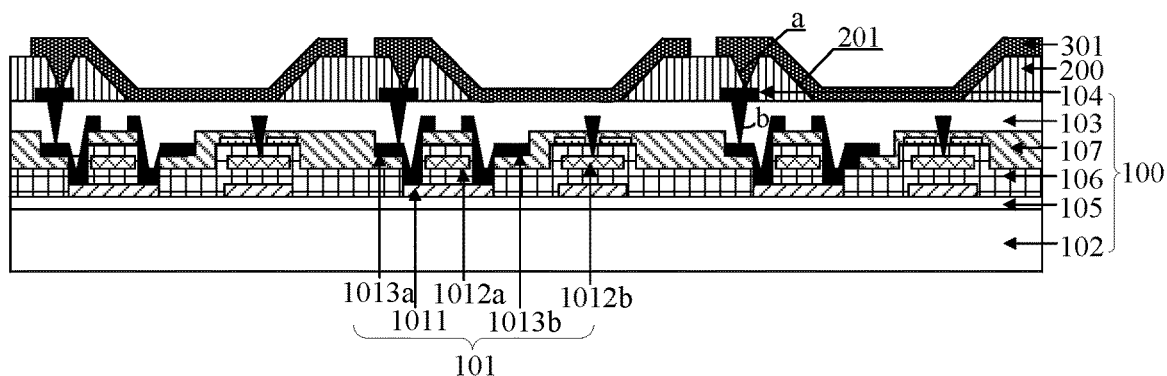
FIG. 6 is a schematic diagram of forming a first electrode according to an embodiment of the present disclosure.

For example, referring to FIG. 6 which is a schematic diagram of forming a first electrode according to an embodiment of the present disclosure, a second conductive film is formed on the substrate 100 on which the first insulation layer 200 is formed, and the one-time patterning process is performed on the second conductive film to form the first electrode 301. The first electrode 301 covers the bottom, proximal to the substrate 100, of the pixel opening 201 and the side wall of the pixel opening 201.

In step B4, a support pattern is formed on the first insulation layer.

Figure 7:
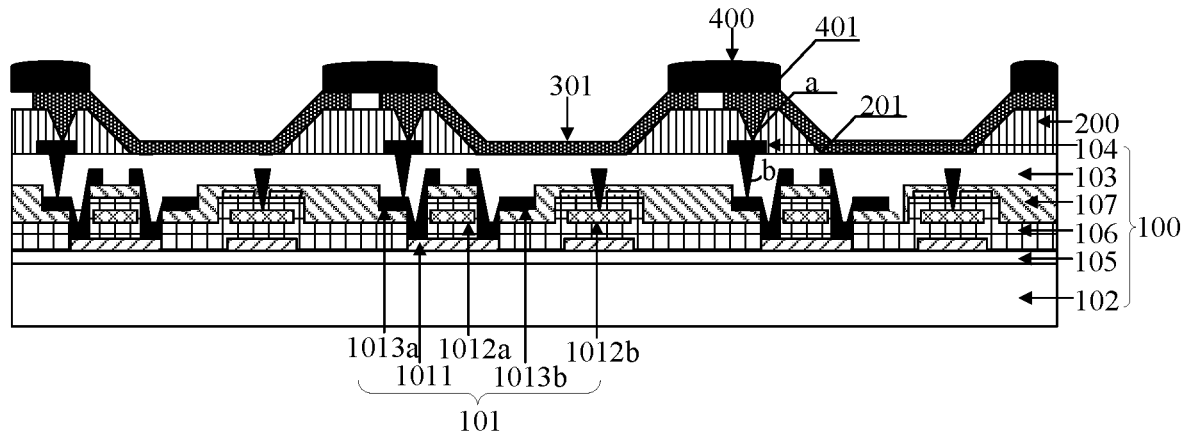
FIG. 7 is a schematic diagram of forming a support pattern according to an embodiment of the present disclosure.

For example, referring to FIG. 7 which is a schematic diagram of forming a support pattern according to an embodiment of the present disclosure, a light-absorbing material film is formed on the substrate 100 on which the first insulation layer 200 is formed, and the one-time patterning process is performed on the light-absorbing material film to form the support pattern 400. The support pattern 400 is disposed outside the pixel opening 201 and is in a mesh shape. The support pattern 400 is provided with an opening 401. In some embodiments, the light-absorbing material may include a black matrix material.

In step B5, a light-emitting layer is formed on the first electrode.

In some embodiments, the material of the light-emitting layer may include a phosphorescent light-emitting material or a fluorescent light-emitting material.

Figure 8:
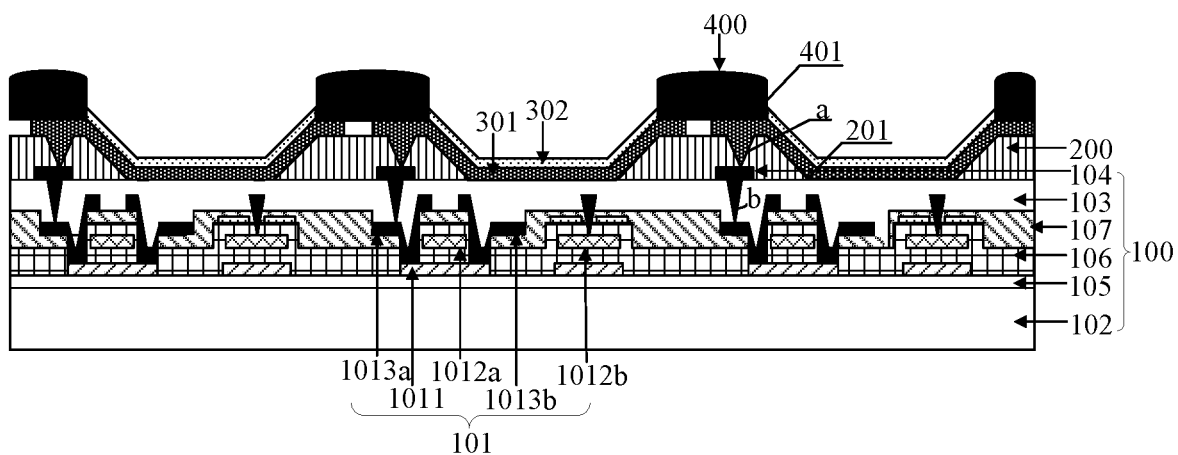
FIG. 8 is a schematic diagram of forming a light-emitting layer according to an embodiment of the present disclosure.

For example, referring to FIG. 8 which is a schematic diagram of forming a light-emitting layer according to an embodiment of the present disclosure, the light-emitting layer 302 is formed by an evaporation process in the pixel opening 201 in the substrate 100 on which the first electrode 301 is formed.

In step B6, a second electrode is formed on the light-emitting layer.

Figure 9:
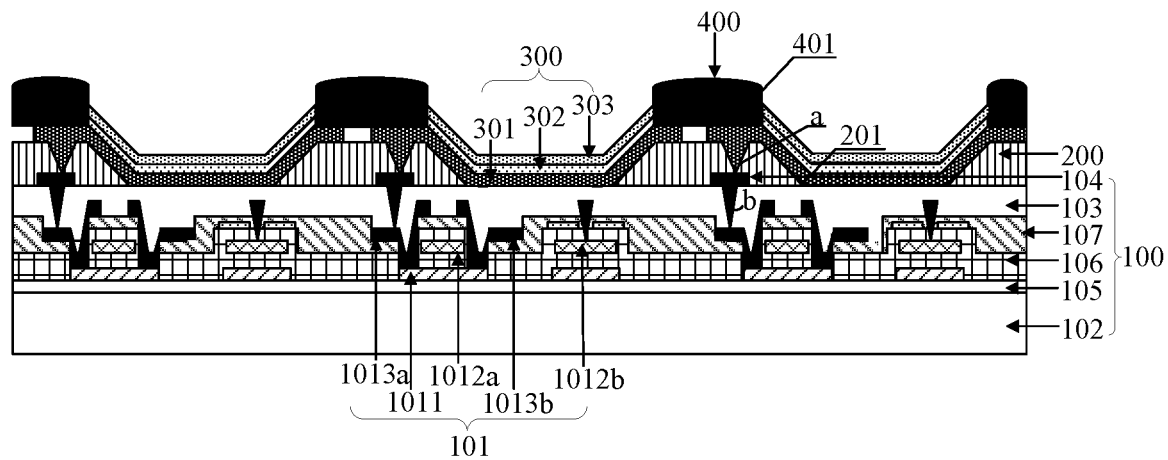
FIG. 9 is a schematic diagram of forming a second electrode according to an embodiment of the present disclosure.

For example, referring to FIG. 9 which is a schematic diagram of forming a second electrode according to an embodiment of the present disclosure, a third conductive film is formed on the substrate 100 on which the light-emitting layer 302 is formed, and the one-time patterning process is performed on the third conductive film to form the second electrode 303. The orthographic projection, on the substrate 100, of the second electrode 303 is staggered from the orthographic projection, on the substrate 100, of the support pattern 400.

It should be noted that, the first electrode 301, the light-emitting layer 302, the second electrode 303 and the like structures can form the light-emitting device 300 in the foregoing embodiment.

In step B7, an encapsulation layer is formed on the light-emitting device.

Figure 10:
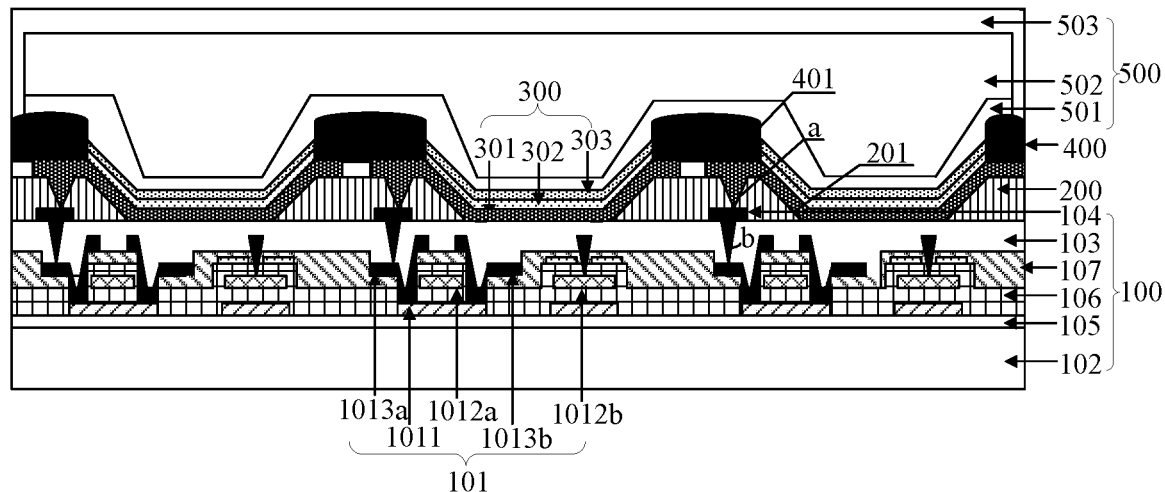
FIG. 10 is a schematic diagram of forming an encapsulation layer according to an embodiment of the present disclosure.

For example, referring to FIG. 10 which is a schematic diagram of forming an encapsulation layer according to an embodiment of the present disclosure, the encapsulation layer 500 is formed on the substrate 100 on which the light-emitting device 300 is formed. The encapsulation layer 500 may include a first inorganic encapsulation layer 501, an organic encapsulation layer 502, and a second inorganic encapsulation layer 503.

In step B8, a plurality of filters are formed on the encapsulation layer.

Figure 11:
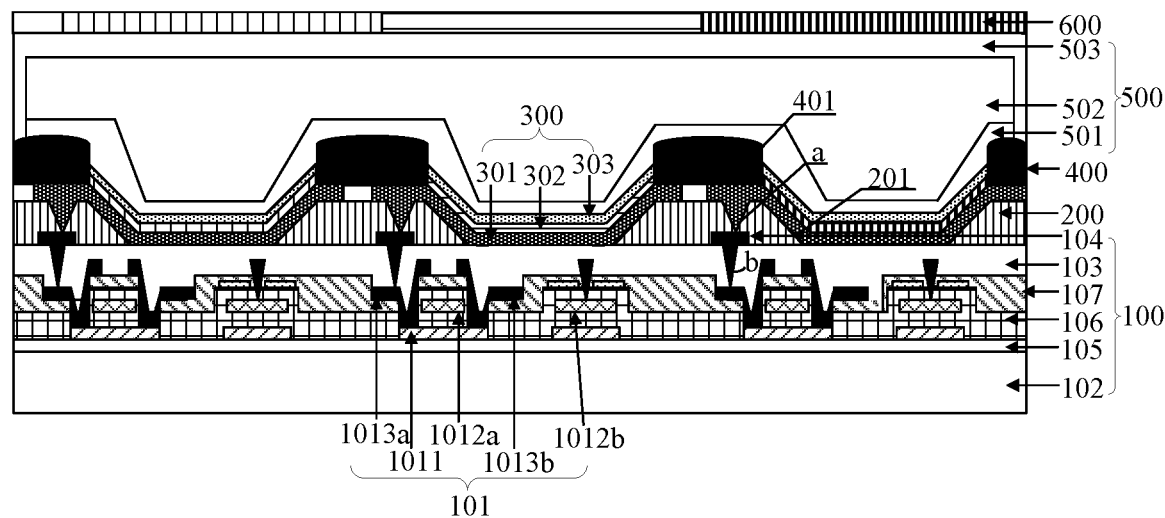
FIG. 11 is a schematic diagram of forming a plurality of filters according to an embodiment of the present disclosure.

For example, referring to FIG. 11 which is a schematic diagram of forming a plurality of filters according to an embodiment of the present disclosure, the plurality of filters 600 are formed on the substrate 100 on which the encapsulation layer 500 is formed. The plurality of filters 600 may include at least two of a red filter, a green filter, and a blue filter.

In step B9, a protective layer is formed on the plurality of filters.

Figure 12:
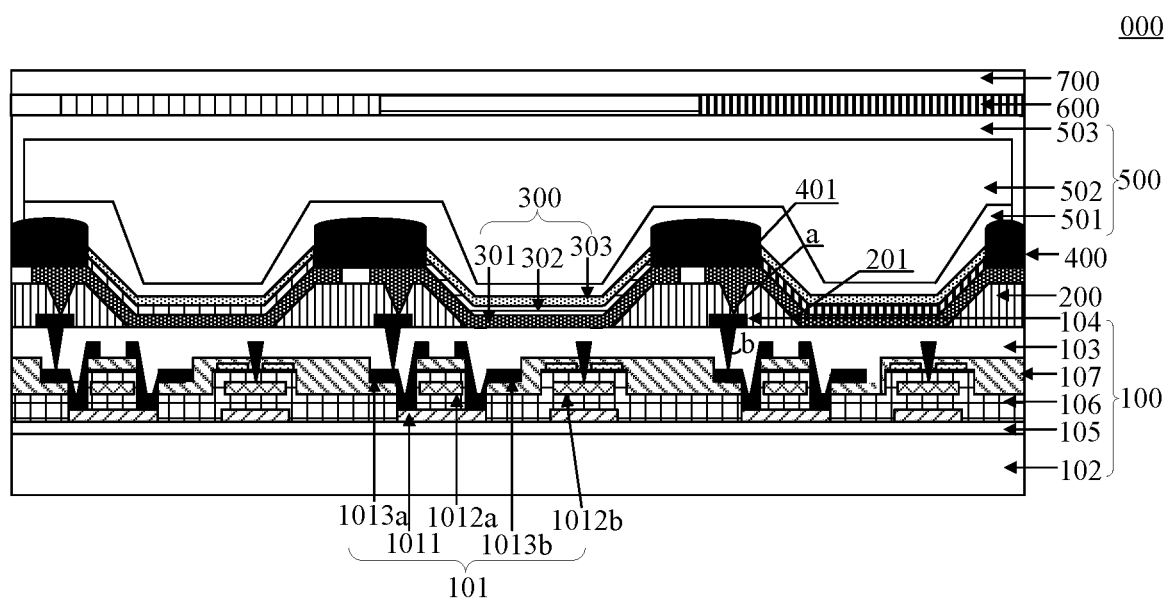
FIG. 12 is a schematic diagram of forming a protective layer according to an embodiment of the present disclosure.

For example, referring to FIG. 12 which is a schematic diagram of forming a protective layer according to an embodiment of the present disclosure, the protective layer 700 is formed on the substrate 100 on which the plurality of filters 600 are formed. In this way, the display panel 000 may be formed.

It should be noted that, the one-time patterning process in the foregoing embodiments may include photoresist coating, exposure, development, etching, and photoresist stripping.

It may be clearly understood by persons skilled in the art that, for the purpose of convenient and brief descriptions, for a detailed principle of the display panel described above, reference may be made to corresponding content in the foregoing embodiments of structure of the display panel, and details are not described herein again.

In summary, according to the method for manufacturing a display panel in this embodiment of the present disclosure, because the support pattern in the display panel is made of the light-absorbing material, the support pattern can replace the black matrix in the display panel. In addition, the orthographic projection, on the substrate, of the support pattern is within the orthographic projection, on the substrate, of the first insulation layer. Therefore, the support pattern is provided with an opening communicated with the pixel opening. In this case, in the display panel, there is only one type of openings, including the pixel openings and the openings in the support pattern that are communicated with each other. In this case, after a reflective structure in the display panel reflects ambient light, reflected ambient light is emitted out from only the openings including the pixel openings and the openings in the support pattern, thereby reducing times of pinhole diffraction generated by ambient light that is reflected only once, and avoiding the phenomenon that reflected ambient light generates twice pinhole diffraction with different diffraction patterns. Therefore, the probability that color separation occurs in the display panel is decreased, and the reliability of the display panel is effectively improved. In addition, the support pattern is used to replace the black matrix, which effectively simplifies the manufacture process of the display panel, and reduces the manufacture cost of the display panel.

An embodiment of the present disclosure further provides a display apparatus.

The display apparatus may include a power supply assembly and the foregoing display panel. For example, for the film layer structure of the display panel, reference may be made to FIG. 3 or FIG. 12. The power supply assembly is configured to supply power to the display panel.

The display apparatus may be any product or component with a display function, such as a mobile phone, a tablet computer, a TV, a display, a notebook computer, a digital photo frame, or a navigator.

It should be noted that, in the accompanying drawings, dimensions of layers and areas may be enlarged for graphical clarity. In addition, it may be understood that, when an element or layer is referred to as being "on" another element or layer, it may be directly disposed on the another element or layer, or there may be an intermediate element or layer. In addition, it may be understood that, when an element or layer is referred to as being "under" another element or layer, it may be directly disposed under the another element or layer, or there may be more than one intermediate element or layer. In addition, it may be understood that, when a layer or element is referred to as being "between" two layers or elements, it may be the only layer or element between the two layers or elements, or there may also be more than one intermediate layer or element. In the entire specification, similar reference numerals indicate similar elements.

In the present disclosure, the terms "first" and "second" are used only for descriptive purposes and cannot be construed as indicating or implying relative importance. Unless otherwise specified, the term "a plurality of" means two or more.

Described above are merely optional embodiments of the present disclosure, but are not intended to limit the present disclosure. Any modifications, equivalent replacements, improvements and the like made within the spirit and principle of the present disclosure shall be included within the scope of protection of the present disclosure.

What is claimed is:

1. A display panel, comprising:
   a substrate;
   a first insulation layer disposed on a side of the substrate, wherein the first insulation layer is provided with a plurality of pixel openings;
   a light-emitting device disposed in the pixel opening;
   a support pattern disposed on a side, distal from the substrate, of the first insulation layer, wherein the support pattern is disposed outside the pixel opening and is made of a light-absorbing material;
   an encapsulation layer disposed on a side, distal from the substrate, of the support pattern, wherein the encapsulation layer is configured to encapsulate the light-emitting device; and
   a plurality of color filters disposed on a side, distal from the substrate, of the encapsulation layer, wherein any two adjacent color filters are in contact with each other.

2. The display panel according to claim 1, wherein the light-absorbing material comprises a black matrix material.

3. The display panel according to claim 2, wherein the support pattern is in a mesh shape, and an orthographic projection, on the substrate, of the pixel opening is within an orthographic projection, on the substrate, of an opening in the support pattern.

4. The display panel according to claim 3, wherein a shape of the orthographic projection, on the substrate, of the opening in the support pattern is the same as a shape of the orthographic projection, on the substrate, of the pixel opening.

5. The display panel according to claim 3, wherein the orthographic projection, on the substrate, of the opening in the support pattern is rectangular.

6. The display panel according to claim 2, wherein the substrate is provided with a signal line electrically connected to the light-emitting device, and an orthographic projection, on the substrate, of the support pattern covers an area where the signal line is disposed.

7. The display panel according to claim 1, wherein an area of an opening surface on a side, proximal to the substrate, of the pixel opening is less than an area of an opening surface on a side, distal from the substrate, of the pixel opening; and the light-emitting device comprises a first electrode, wherein the first electrode is at least partially in contact with a side wall of the pixel opening.

8. The display panel according to claim 7, wherein the first electrode covers a bottom, proximal to the substrate, of the pixel opening and the side wall of the pixel opening.

9. The display panel according to claim 7, wherein the light-emitting device further comprises a light-emitting layer and a second electrode, wherein
the light-emitting layer is disposed on a side, distal from the substrate, of the first electrode; the second electrode is disposed on a side, distal from the first electrode, of the light-emitting layer; and an orthographic projection, on the substrate, of the second electrode is not overlapped with an orthographic projection, on the substrate, of the support pattern.

10. The display panel according to claim 9, wherein the substrate is provided with a pixel driving circuit electrically connected to the first electrode, and the first insulation layer is further provided with a first connecting hole, wherein
the first electrode is electrically connected to the pixel driving circuit through the first connecting hole, and an orthographic projection, on the substrate, of the first connecting hole is not overlapped with an orthographic projection, on the substrate, of the light-emitting layer.

11. The display panel according to claim 10, wherein the substrate comprises a base, as well as the pixel driving circuit, a second insulation layer, and a connecting electrode that are disposed on a side of the base, wherein
the second insulation layer is provided with a second connecting hole; the connecting electrode is electrically connected to the pixel driving circuit through the second connecting hole; and the first electrode is electrically connected to the connecting electrode through the first connecting hole.

12. The display panel according to claim 11, wherein an orthographic projection, on the base, of the second connecting hole is overlapped with at least part of an orthographic projection, on the base, of the first connecting hole.

13. The display panel according to claim 12, wherein a thickness of the second insulation layer ranges from 2 to 5 micrometers.

14. The display panel according to claim 9, wherein the first electrode is a reflective electrode made of a reflecting metal material, and the second electrode is a light-transmitting electrode made of a transparent conductive material.

15. The display panel according to claim 1, wherein the encapsulation layer comprises a first inorganic encapsulation layer, an organic encapsulation layer, and a second inorganic encapsulation layer that are laminated.

16. The display panel according to claim 1, further comprising: a protective layer disposed on a side, distal from the substrate, of the plurality of color filters.

17. A method for manufacturing a display panel, comprising:
providing a substrate;
forming a first insulation layer on a side of the substrate, wherein the first insulation layer is provided with a plurality of pixel openings;
forming a light-emitting device in the pixel opening;
forming a support pattern on a side, distal from the substrate, of the first insulation layer, wherein the support pattern is disposed outside the pixel opening and is made of a light-absorbing material;
forming an encapsulation layer on a side, distal from the substrate, of the support pattern, wherein the encapsulation layer is configured to encapsulate the light-emitting device; and
forming a plurality of color filters on a side, distal from the substrate, of the encapsulation layer, wherein any two adjacent color filters are in contact with each other.

18. A display apparatus, comprising: a power supply assembly and a display panel, wherein the power supply assembly is configured to supply power to the display panel; and the display panel comprises:
a substrate;
a first insulation layer disposed on a side of the substrate, wherein the first insulation layer is provided with a plurality of pixel openings;
a light-emitting device disposed in the pixel opening;
a support pattern disposed on a side, distal from the substrate, of the first insulation layer, wherein the support pattern is disposed outside the pixel opening and is made of a light-absorbing material;
an encapsulation layer disposed on a side, distal from the substrate, of the support pattern, wherein the encapsulation layer is configured to encapsulate the light-emitting device; and
a plurality of color filters disposed on a side, distal from the substrate, of the encapsulation layer, wherein any two adjacent color filters are in contact with each other.

* * * * *